United States Patent [19]

Benkara et al.

[11] Patent Number: 4,797,846
[45] Date of Patent: Jan. 10, 1989

[54] DIGITAL RESONANT FILTER

[75] Inventors: Ferial Benkara, Bagneux, France; Daniel Campbell, Palos Verdes East, Calif.

[73] Assignee: Enertec, Montrouge, France

[21] Appl. No.: 735,234

[22] Filed: May 17, 1985

[30] Foreign Application Priority Data

May 21, 1984 [FR] France .................. 84 07846

[51] Int. Cl.$^4$ .................................................. G06F 7/38
[52] U.S. Cl. .............................................. 364/724.17
[58] Field of Search .................................... 364/724

[56] References Cited

U.S. PATENT DOCUMENTS

| | | | |
|---|---|---|---|
| 3,543,012 | 11/1970 | Courtney . | |
| 3,619,586 | 11/1971 | Hoff . | |
| 4,223,389 | 9/1980 | Amada et al. | 364/724 |
| 4,255,794 | 3/1981 | Nakayama | 364/724 |
| 4,317,092 | 2/1982 | Potter | 364/724 |
| 4,422,156 | 12/1983 | Sano | 364/724 |
| 4,467,440 | 8/1984 | Sano et al. | 364/724 |
| 4,489,391 | 12/1984 | Morikawa | 364/724 |
| 4,495,591 | 1/1985 | Loomis, Jr. | 364/724 |
| 4,521,867 | 6/1985 | Kasuga | 364/724 |
| 4,524,422 | 6/1985 | Kasuga | 364/724 |
| 4,630,299 | 12/1986 | Welles, II et al. | 364/724 |
| 4,653,016 | 3/1987 | Mueller | 364/724 |

OTHER PUBLICATIONS

Design of Chebyshev Digital Bandpass Filters, B. I. Yavorskiy et al.
"Proceedings of the Nat. Electr. Conference", vol. 25, 8–10, Dec. 1969—pp. 691–693.
"IEEE Transactions on Acoustics, Speech, and Signal Processing", vol. ASSP-22, No. 6, Dec. 1974.
"Journal of the Audio Engineering Society", Oct. 1979, vol. 27, No. 10—pp. 793–803.

Primary Examiner—Gary V. Harkcom
Assistant Examiner—Dale M. Shaw
Attorney, Agent, or Firm—Sanford J. Asman

[57] ABSTRACT

A band pass digital filter which may be straightforwardly implemented. Considering successive samples I the last of which is N and input samples XI and output samples YI, the filter, in one embodiment, conforms to the expression:

$$Y_N = 2^{-K+J} \cdot (X_N - X_{N-2}) - C_4 Y_{N-1} - Y_{N-2} + 2^{-K} \cdot Y_{N-2}$$

where J and F are integers.

10 Claims, 2 Drawing Sheets

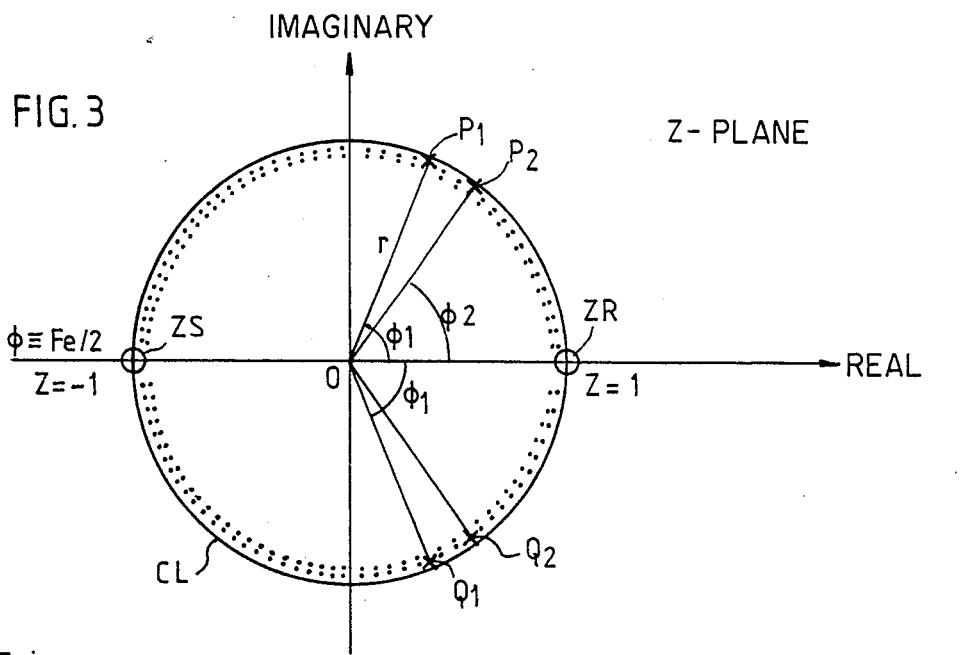
FIG. 3
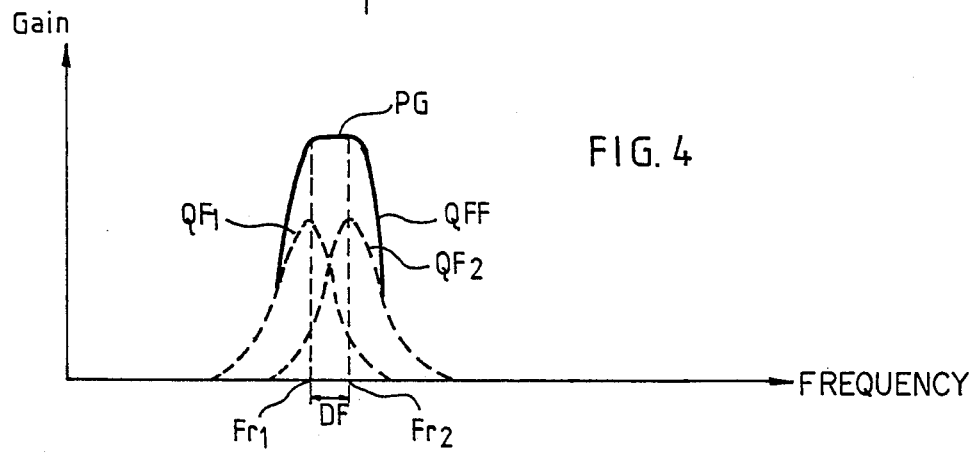
FIG. 4
FIG. 5
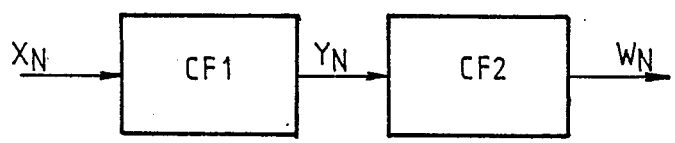

DIGITAL RESONANT FILTER

The present invention relates to a recursive digital filter comprising at least a first filter stage of which the transfer function, in complex Z notation, has the general form:

$$H(Z)=(A_0+A_1.Z^{-1}+A_2.Z^{-2})/(1+C_4.Z^{-1}+C_5.Z^{-2})$$

and having two zeros corresponding to the solutions of the equation: $A_0+A_1.Z^{-1}+A_2.Z^{-2}=0$, and two poles corresponding to the solutions of the equation $1+C_4.Z^{-1}+C_5.Z^{-2}=0$, the poles and the zeros being included by a circle of unitary radius centred at the origin of the real and imaginary axes of the complex plane, and the poles being represented by complex co-ordinates the polar radius of which is sufficiently close to unity such that the filter stage provides a filter pass band about a centre frequency, and the arguments of which are, in absolute value, representative of the centre working frequency of that stage.

Digital filters called "second order", having a transfer function of this type, and those using second order filter stages characterized by such a transfer function, are well known and may be physicaly implemented in a number of ways, also known to those skilled in the art.

Filters of this type, and their implementation, are for example described amongst others in the journal "Proceedings of the nat. electr. conference, vol 25, Dec. 8–10, 1969 pp 691", in the journal "IEEE Transactions on Acoustics, Speech, and Signal Processing, vol. ASSP-22, No. 6, December 1974, pp 456", in the journal "Journal of the Audio Engineering Society, 1979 October, vol. 27, No. 10, pp 793", and in U.S. Pat. No. 4,422,156.

However, although known in their general form and in forms for specific applications, such filters make up an infinite family, the elements of which, known or theoretically derivable from the general form, are clearly distinguished one from another in a number of respects, in particular by the values of the coefficients of their transfer function, on which depends their filter characteristics, by their possible applications, and by their succeptibility to be made to work in physically realisable form.

In this connection, a first object of the invention is to provide a numerical filter which may be implemented with a straightforward material, in particular by means of a special purpose integrated circuit, and to provide a selective filter useable as a receiver for radio control.

To this end, a filter in accordance with the invention is characterized in that first and third coefficients $A_0$ and $A_2$ of the transfer function are equal or substantially equal and of opposite sign whilst a second coefficient $A_1$ is zero or substantially zero, zeros being arranged at points along the real axis of respective abcissae $-1$ and $+1$, or close to these points, and in that a fifth coefficient $C_5$ of the transfer function is greater than 0.8, such that the filter stage filters by resonance in a band centered about a resonant frequency and such that the bandwidth of the filter stage and its gain for a signal at the resonant frequency are substantially independent of the resonant frequency and only depend upon the difference between unity and the polar radius of poles.

Resonance imparts an adequate selectivity to the filter stage, and independence between resonant frequency and gain of the stage allows straightforward tuning of these two parameters.

A second object of the invention is to provide a programmable digital filter requiring only a limited number of straight forward mathematical operations.

To this end, a filter in accordance with the present invention is characterized in that the fifth coefficient $C_5$ of the transfer function is selected to be equal to 1-2 to the power $(-K)$, where K is an integer, such that the bandwidth of a first filter stage may be adjusted in relatively large proportions by selecting the integer K within a relatively narrow range, and such that the product $C_5.Z^{-2}$ may be directly obtained by a binary shift of K bit positions and a single algebraic summation.

Whilst binary multiplication conventionally requires several shifts and several algebraic summations when the factors are not multiples of 2; and whilst neither the coefficients $C_5$, having a value close to 1, nor the output pattern of the filter delayed by two units of time, represented symbolically by $Z^{-2}$, are multiples of 2, the product $C_5.Z^{-2}$ may nevertheless be obtained by a single shift and a single algebraic summation.

Tuning of resonant frequency of the filter stage may be effected, in practice independently of bandwidth and gain of the stage, by selecting a value of a fourth coefficient $C_4$ of the transfer function between 2 and $-2$.

The digital filter in fact comprises several cascaded filter stages, for example two stages the poles of which have substantially the same radius, and which thus have substantially the same pass band and the same gain.

The positive arguments of the poles of the two stages may have a difference between them less than any one of the arguments, the stages thus having different resonant frequencies of which the difference is less than any one of the frequencies.

In particular, the frequency difference between two stages may be less than 1.5 times the width of the pass band of each stage, with the result that the overall gain of the two cascade stages is approximately constant in at least the range of frequency defined between the resonant frequencies of the two stages.

It will thus be appreciated that the integer K defining the fifth coefficient is fixed at the same value for the two stages, which have the same pass band and the same gain, whatever their respective resonant frequency might be.

If moreover the difference in resonant frequency of the two stages is in the region of 1.3 times the bandwidth of each stage, the overall gain of the two stages in cascade is then constant in the range of frequency defined between the resonant frequencies of the two stages.

It may also be noted that the first and fourth coefficients $A_0$ and $A_2$ of the transfer function of the first stage at least may be decreasing functions of the integer K, the gain of this stage at its resonant frequency thus being constant and independent of both this resonant frequency and of bandwidth of the stage.

In particular, it will be appreciated that the coefficients $A_0$ and $A_2$ may be expressed as a function to the power of 2 of the integer K, such that gain is as constant as possible and that calculations are reduced to the greatest possible extent by binary shift operations.

Other features and advantages of the invention will become clear from the following description, given by way of non-limitative example, with reference to the accompanying drawings, of which, FIG. 1 is a schematic representation of a second order filter or a filter stage of the prior art, FIG. 2 is a schematic representation of a second order filter or a filter stage in accordance with an aspect of the invention;

FIG. 3 is a representation in the complex Z plane, of the operation of a two stage filter in accordance with an aspect of the present invention;

FIG. 4 is a gain-frequency plot of the filter stages as represented in FIG. 3;

FIG. 5 is a diagram of the same filter, showing the two stages in cascade;

Figure 1:
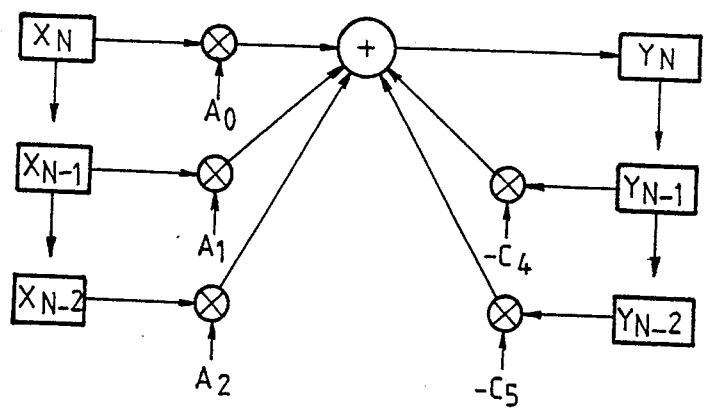
FIG. 1 represents, in a general way, a second order digital filter stage.

Such a stage receives, at a sampling frequency $F_e$, successive binary digital input samples $X_N$, and provides successive binary digital output samples $Y_N$.

The derivation of an output sample $Y_N$ from an input sample $X_N$ requires knowledge of previous input samples $X_{N-1}$ and $X_{N-2}$ as well as previous output samples $Y_{N-1}$ and $Y_{N-2}$.

The input sample $X_{N-1}$ is that which has immediately preceeded the input sample $X_N$ at the sampling frequency; similarly for $X_{N-2}$ with respect to $X_{N-1}$, for $Y_{N-1}$ with respect to $Y_N$ and for $Y_{N-2}$ with respect to $Y_{N-1}$.

The input samples $X_N$, $X_{N-1}$ and $X_{N-2}$ are multiplied by the first, second and third coefficients $A_0$, $A_1$ and $A_2$ respectively; the output samples $Y_{N-1}$ and $Y_{N-2}$ are multiplied by the fourth and fifth coefficeints $C_4$ and $C_5$ respectively of opposite sign, and the output sample $Y_N$ is obtained by algebraic summation of the products.

The complex transfer function of such a filter stage, conventionally designated H(Z), is given by the expression:

$$H(Z)=(A_0+A_1.Z^{-1}+A_2.Z^{-2})/(1+C_4.Z^{-1}+C_5.Z^{-2})$$

where $Z^{-1}$ represents a delay corresponding to one cycle of a signal at the sampling frequency, that is to a delay such as that between he samples $X_{N-1}$ and $X_N$.

In a representation in the complex number plane Z, defined by the real number axis R and the purely imaginary numer axis I, the transfer function H(Z) is characterized by two poles (such as $P_1$, $Q_1$, or $P_2$, $Q_2$ in FIG. 3) and two zeros (such as ZR, ZS in FIG. 3).

The zeros are solutions to the equation:

$$A_0+A_1.Z^{-1}+A_2.Z^{-2}=0$$

and the poles are solutions to the equation:

$$1+C_4.Z^{-1}+C_5.Z^{-2}=0$$

In order that the series of successive output samples $Y_N$ does not diverge, it is necessary to select the coefficients $A_0$, $A_1$, $A_2$, $C_4$ and $C_5$ in such a way that the poles and the zeros included by the circle CL of unity radius centred on the origin O of the axes R and I. The poles (such as $P_1$, $Q_1$ in FIG. 3) are represented by complex number co-ordinates defined by a polar radius (such as r in FIG. 3) and an argument (such as $\underline{01}$ or $-\underline{01}$). For values of modulus of radius r sufficiently different from zero, the filter stage provides a filter pass-band about a centre working frequency. The closer the modulus of the polar radius r is to unity, the greater is the selectivity of the stage.

The absolute value (such as $\underline{01}$) of the argument of the poles is representative of the center working frequency of the filter stage.

The sampling frequency $F_e$ corresponds to a complete trigonometrical rotation, that is to 360°, about the origin 0, from the point Z=1 the unity abscissa on the real axis.

By virtue of Shannon's theorem, filters may be realised with all center frequencies between 0 and half the sampling frequency $F_e$.

A filter stage or filter in accordance with the present invention is such that:
$A_2 = -A_0$
$A_1 = 0$, and
$C_5 = 0.8$.

Preferably, $A_2 = -A_0 = 0$ and $C_5$ is greater than 0.9.

As a first result of these characteristics; the zeros ZR, ZS of the transfer function H(Z) of the stage considered are placed at the points Z=1 and Z=−1, at absiccae +1 and −1 respectively of the axis R, or in the immediate vacinity of these points.

As another result of these same characteristics, the stage considered provides a filter pass band by resonance the center frequency of which is the resonant frequency, and the bandwidth of the stage and its gain for a signal at the resonant frequency are substantially independent of the resonant frequency and only dependent upon the difference $1-C_5$.

Further, the transfer function of a second order filter stage having these characteristics is of the form $$H(Z)=A_0.(1-Z^{-2})/(1+C_4.Z^{-1}+C_5.Z^{-2}). \quad (1)$$

Thus, instead of requiring 5 multiplications and 4 additions, as the filter stage shown in FIG. 1, a stage having the latter transfer function requires only three multiplications and three additions.

However, the implementation of such a filter stage may be still considerably simplified, in particular with the object of providing a programmable filter stage, by giving the fifth co-efficient $C_5$ the value:

$$C_5=1-2^{-K}$$

where K is an integer, for example greater than 4.

The transfer function then becomes:

$$H(Z)=A_0.(1-Z^{-2})/(1+C_4.Z^{-1}+Z^{-2}-2^{-K}.Z^{-2}). \quad (2)$$

Figure 2:
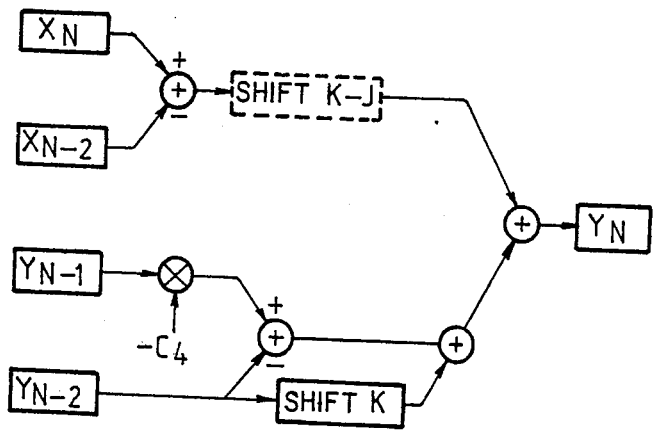

For the case where the coefficients $A_0$ is equal to unity, such a filter stage has the form of the diagram of FIG. 2, in which the block "SHIFT K−J" is short-circuited.

For such a stage, an output sample $Y_N$ is given by:

$$Y_N = X_N - X_{N-2} - C_4.Y_{N-1} - Y_{N-2} + 2^{-K}.Y_{N-2}. \quad (3)$$

Since the term $2^{-K}$ may then be obtained directly by a straightforward binary shift of K bit positions in the direction of the least significant bit, implemented for example in the shift register "SHIFT K", the output sample $Y_N$ is obtained by means of a single multiplication, 4 additions and a shift. The considerable reduction in the number of multiplications allows an important relaxation of the resources necessary to implement such a filter stage and/or an increase in processing speed.

It may be shown that the fourth coefficient $C_4$ is given by the relationship:

$$C_4 = -2r.\cos \underline{0}$$

Where 0 represents the argument of one of the poles of the form:

$$C_4 = -2r.\cos (2.PI.Fr/Fe)$$

Where $F_r$ is the desired resonant frequency and $PI = 3.14159$.

For a filter stage having the transfer function given by equation (2) or in accordance with equation (3), the coefficient $C_4$ may have the value:

$$C_4 = (2^{-K} - 2).\cos (2.PI.Fr/Fe).$$

Since $2^{-K}$ is very small, the coefficient $C_4$ may in practice be selected in the range 2 to $-2$, corresponding to resonant frequencies between $F_e/2$ and 0, or a fortiori in the further restricted range from 0 to $-2$, correspodning to resonant frequencies between $F_e/4$ and 0, as is the case for the filter stages in accordance with the non-limitative example given at the end of the present desscription.

It can also be shown that the gain of a stage satisfying equation (2) with $A_0 = 1$, that is still in accordance with equation (3), is very close to $2^{K+1}$ for a signal of the resonant frequency.

Consequently the integer K may be used to normalize the gain of the filter stage in a way such that the latter has a constant gain whatever the integer K and the co-efficient $C_4$ that is whatever the pass band and resonant frequency of the stage.

This is obtained by arranging the stages to have a transfer function directly derived from equation (2) by giving $A_0$ a value proportional to $2^{-(K+1)}$, and for example the transfer function:

$$H(Z) = 2^{-K+J}.(1 - Z^{-2})/(1 + C_4 Z^{-1} + Z^{-2} - 2^{-K}.Z^{-2}) \quad (4)$$

where J represents an integer, being positive or negative independent of K.

For such a stage, the output samples are given by equation:

$$Y_N = 2^{-K+J}.(X_N - X_{N-2}) - C_4.Y_{N-1} - Y_{N-2} + 2^{-K}.Y_{N-2} \quad (5)$$

Such a stage is represented in FIG. 2 in which the register "SHIFT K" performs a binary shift corresponding to multiplication by $2^{-K}$ (that is a shift of K bit positions) and in which the register "SHIFT K−J" performs a binary shift corresponding to multiplication by $Z^{-K+J}$ (that is a shift of K−J bit positions, in one direction or J−K in the other).

For each constant integer J, the bandwidth of the filter stage the transfer function of which satisfies equation (4), and its resonant frequency, may be independently controlled by selecting the integer K and the coefficient $C_4$, without altering the gain of the stage for the selected resonant frequency.

In practice, it is often necessary, in order to implement a filter, to arrange several filter stages in cascade, and in particular two stages CF1, CF2 as shown in FIG. 5. The second stage CF2 provides output samples $W_N$ by using as input sampels the output samples $Y_N$ of the first stage CF1.

With such an arrangement it is possible not only to realise the advantages of the invention as already described, but also to benefit from the additional advantage of being able to realise in a simple way a filter characteristic having a flat gain PG in a region of frequency DF between the resonant frequencies Fr1 and Fr2 of two stages CF1 and CF2, as shown in FIG. 4.

This is obtained by giving to filter stages CF1 and CF2 close resonant frequencies and substantially constant bandwidths.

It is possible to select for example strictly identical bandwidths and respective resonant frequencies Fr1, Fr2 such that the difference DF in the frequencies is less than 1.5 times or even, more precisely, close to 1.3 times, the bandwidth of each stage.

It may be shown that in fact if the resonant frequencies $Fr_1$ and $Fr_2$ are identical for stages for which the transfer functions conform to equation (2) with the same value of coefficient $A_o$, the bandwidth LB4 of a fourth order filter comprising two cascaded second order stages CF1 and CF2 is linked to the bandwidth LB2 of each stage by the relationship:

$$LB4 = ((2)^{\frac{1}{2}} - 1)^{\frac{1}{2}}.LB2, \text{ giving}$$

$$LB4 = 0.644.LB2$$

Thus it may be seen that, if one defines by QFF the filter characteristics of the fourth order filter of FIG. 5, formed by the superposition of filter characteristics QF1 and QF2 of stages CF1 and CF2 (cf FIG. 4), the characteristic QFF has a gain plateau PG which is perfectly flat if the frequency difference $FD = |Fr1 - Fr2|$ is such that:

$$DF = 2.LB4, \text{ that is } DF = 1.288.LB2.$$

FIG. 3 represents, in the complex plane, transfer function poles and zeros in accordance with equation (4) of two filter stages CF1 and CF2 having the respective filter characteristics QF1 and QF2.

These filter stages are defined by the same value of the integer K; the poles $P_1$, $Q_1$, $P_2$, $Q_2$ have the same molulus r; the zeros of both stages are at the absiccae points $+1$ and $-1$ of the axis R and the respective coefficeints $C_4$ of both stages are given by:

$$C_4 = -2r.\cos (2.PI.Fr1/Fe) = -2r.\cos \underline{01}$$

$$C_4 = -2r.\cos (2.PI.Fr2/Fe) = -2r.\cos \underline{02}$$

In fact, the coefficients $C_4$ are determined by binary words which only respresent the values hereindefined to a finite precision.

This state of affairs is illustrated diagrammatically by a group of points at the perimeter of the circle of FIG. 3, these points representing the only positions which the poles may adopt, because of quantising of the coefficients $C_4$ and $C_5$.

By way of an illustrative non limitative example, a fourth order filter for a radio control receiver may be implemented by means of two second order filter stages CF1 and CF2 having the following characteristics:
Sampling frequency: Fe = 8192 Hz
Possible K values: 6 to 9 inclusive
Possible $C_4$ values: 0 to $-2$
Coding for $C_4$: 14 bits J values: 3 for CF1; 0 for CF2
Possible LB4 values: 0.02% to 0.31% of Fe
Center frequency: 160 to 1600 Hz.

We claim:
1. A recursive digital filter, comprising:
at least a first filter stage for receiving successive digital input samples $X_N$ and in response providing successive digital output samples $Y_N$, said filter stage having a z-transform transfer function

$$H(Z) = (A_0 + A_1 * Z^{-1} + A_2 * Z^{-2})/1 + C_4 * Z^{-1} + C_5 * Z^{-2})$$

and having two zeros at frequencies defined by solutions of the equation:

$$A_0 + A_1 A^{-1} + A_2 Z^{-2} = 0$$

and two poles at frequencies defined by solutions of the equation $$1 + C_4 * Z^{-1} + C_5 Z^{-2} = 0$$

said filter stage including
(a) means for positioning the poles and the zeros in a circle of unitary radius centered at the origin of the real and imaginary axes of the complex plane, the poles being represented by complex coordinates the polar radius of which is sufficiently close to unity such that the filter stage provides a filter pass band about a center frequency, the arguments of which are, in absolute value, representative of the center working frequency of said stage;
(b) means for forming coefficients $A_0$ and $A_2$ of the transfer function to be substantially equal and of opposite sign and a coefficient $A_1$ to be zero, with the zeros positioned at points along or close to the real axis of respective abscissae $-1$ and $+1$; and
(c) means for forming a coefficient $C_5$ to be greater in magnitude than 0.8,
the filter stage filtering by resonance a band centered about a resonant frequency, the bandwidth of the filter stage and its gain for a signal at the resonant frequency depending only upon the difference between unity and the polar radius of poles.

2. A digital filter as claimed in claim 1 wherein the coefficient $C_5$ of the transfer function is selected to be equal to 1-2 to the power (-K), where K is an integer, such that the bandwidth of a first filter stage, suitable for use as a programmable stage, may be adjusted in relatively large proportions by selecting the integer K within a relatively narrow range, and such that the product $C_5.Z^{-2}$ may be directly obtained by a binary shift of K bit positions and a single algebraic summation.

3. A digital filter as claimed in claim 2 wherein the coefficient $C_4$ of the transfer function is selected between 2 and $-2$, the coefficient selection allowing tuning of the resonant frequency of a first stage in practice independent of stage bandwidth and gain.

4. A digital filter as claimed in claim 2 wherein said filter includes at least a second stage, similar to the first and arranged in cascade with the first stage, the poles of the two stages having substantially the same polar radius and the stages having substantially the same pass band and the same gain.

5. A digital filter as claimed in claim 4 wherein the positive arguments of the poles of the two stages have a difference between them less than any one of the arguments, the stages thus having different resonant frequencies of which the difference is less than any one of the frequencies.

6. A digital filter as claimed in claim 5 wherein the frequency difference between the two stages is less than 1.5 times the width of the pass band of each stage, with the result that the overall gain of the two cascade stages is approximately constant in at least the range of frequency defined between the resonant frequencies of the two stages.

7. A digital filter as claimed in claim 4 wherein the integer K is fixed at the same value for the two stages, which have the same pass band and the same gain, whatever their respective resonant frequency might be.

8. A filter as claimed in claim 7 wherein the difference in resonant frequency of the two stages is in the region of 1.3 times the bandwidth of each stage, the overall gain of the two stages in cascade being constant in the range of frequency defined between the resonant frequencies of the two stages.

9. A filter as claimed in claim 2 wherein the coefficients $A_0$ and $A_2$ of the transfer function of the first stage at least are decreasing functions of the integer K, the gain of this stage at its resonant frequency thus being constant and independent of both this resonant frequency and of bandwidth of the stage.

10. A filter as claimed in claim 9 wherein the said functions are functions expressed to a power of 2.

* * * * *